United States Patent
Aparin et al.

[11] Patent Number: 6,166,599
[45] Date of Patent: Dec. 26, 2000

[54] IMPEDANCE MATCHING NETWORKS FOR NON-LINEAR CIRCUITS

[75] Inventors: Vladimir Aparin; Charles J. Persico, both of San Diego, Calif.

[73] Assignee: Qualcomm, Inc., San Diego, Calif.

[21] Appl. No.: 09/330,494

[22] Filed: Jun. 11, 1999

Related U.S. Application Data

[60] Provisional application No. 60/111,035, Dec. 4, 1998, and provisional application No. 60/111,315, Dec. 7, 1998.

[51] Int. Cl.[7] .................................. H03F 1/26; H03F 1/30
[52] U.S. Cl. ........................ 330/149; 330/302; 375/296; 375/297
[58] Field of Search .................................... 330/149, 302; 375/296, 297

[56] References Cited

U.S. PATENT DOCUMENTS 5,592,122  1/1997  Masahiro ................................ 330/302

*Primary Examiner*—Michael B. Shingleton
*Attorney, Agent, or Firm*—Philip Wadsworth; Charles D. Brown

[57] ABSTRACT

Techniques to reduce intermodulation distortion at the output of an active circuit having even-order and odd-order nonlinearities. The IM3 products generated by the even-order nonlinearity of the active circuit are canceled against the IM3 products generated by the odd-order nonlinearity. The amplitude and phase of the IM3 products can be manipulated by adjusting either the source or load impedance, or both, of the active circuit. The amplitude and phase of the IM2 products generated by the even-order nonlinearity can be manipulated by adjusting the impedance of the active circuit at sub-harmonic and second harmonic frequencies (i.e., the frequencies of the IM2 products). The amplitude and phase of the IM3 products generated by the odd-order nonlinearity can be manipulated by adjusting the impedance of the active circuit at the fundamental frequency. By properly tuning or "matching" the impedance of either the source or load, or both, of the active circuit at either the sub-harmonic or second harmonic frequency, or both, the amplitude and phase of the IM2 products can be adjusted such that the IM3 products resulting from the even-order nonlinearity approximately cancel the IM3 product(s) resulting from the odd-order nonlinearity.

24 Claims, 10 Drawing Sheets

IMPEDANCE MATCHING NETWORKS FOR NON-LINEAR CIRCUITS

This application claims the benefit of U.S. provisional Application Ser. No. 60/111,035, entitled "Device and Method to Reduce Intermodulation Distortion," filed Dec. 4, 1998, and Ser. No. 60/111,315, entitled "Device and Method for Reducing Third Order Intermodulation Distortion in Non-Linear Circuits," filed Dec. 7, 1998, both of which are incorporated herein by reference.

BACKGROUND OF THE INVENTION

The present invention relates to electronics circuits, and more particularly to impedance matching networks that reduce intermodulation distortion of active circuits.

Active circuits, such as low noise amplifiers (LNAs) and power amplifiers (PAs), are commonly used in many electronics circuits, including receivers and transmitters of communications systems. The performance of an active circuit can be quantified by its linearity, noise figure, power consumption, and so on. Generally, these characteristics impose conflicting design considerations.

A memoryless active circuit can be approximated by the following transfer function:

$$y(x)=a_1 \cdot x + a_2 \cdot x^2 + a_3 \cdot x^3 + \text{higher order terms}, \quad \text{Eq (1)}$$

where x is the input signal, y(x) is the output signal, and $a_1$, $a_2$, and $a_3$ are coefficients that define the linearity of the active circuit. To simplify the analysis, the higher order terms (i.e., terms above third order) are typically ignored. For an ideal linear active circuit, coefficients $a_2$ and $a_3$ are 0.0 and the output signal is simply the input signal scaled by $a_1$. However, all active circuits experience some amounts of nonlinearity, which is quantified by coefficients $a_2$ and $a_3$. Coefficient $a_2$ defines the amount of second-order nonlinearity and coefficient $a_3$ defines the amount of third-order nonlinearity.

Active circuits are used in narrow band communications systems that operate on an input RF signal having a predetermined bandwidth and center frequency. The input RF signal typically comprises the desired signal and other undesired signals located throughout the frequency spectrum. Nonlinearity within the active circuits causes intermodulation of the undesired signals, resulting in products that may fall into the desired signal band.

As an example, consider an input RF signal that includes a desired signal m(t) centered at $f_d$ and undesired (i.e., spurious) signals at $f_1$ and $f_2$. The input RF signal can be expressed as:

$$x(t) = m(t) + g_1 \cdot \cos(\omega_1 t) + g_2 \cdot \cos(\omega_2 t). \quad \text{Eq (2)}$$

When the input RF signal x(t) is provided to an active circuit having the transfer function of equation (1), where $a_2$ and $a_3$ are non-zero values, intermodulation products are generated.

FIG. 1A is a diagram illustrating the input RF signal and the intermodulation products. Specifically, the second-order nonlinearity of the active circuit (i.e., caused by the $x^2$ term in equation 1) creates second-order intermodulation (IM2) products at various frequencies. The IM2 products include those at the frequencies $(f_2-f_1)$, $(2 \cdot f_1)$, $(2 \cdot f_2)$, and $(f_1+f_2)$ due to the undesired signals. These IM2 products appear at the output of the active circuit and also appear at the input of the active circuit due to the non-linear input impedance of the active circuit and the coupling between the output and input. The same second-order nonlinearity of the active circuit then mixes these IM2 products with the original undesired signals to produce third-order intermodulation (IM3) products at many frequencies, including those that fall into the desired band. Additionally, the third-order nonlinearity of the active circuit (e.g., caused by the $x^3$ term in equation 1) creates IM3 products at the same frequencies as the IM3 products from the second order nonlinearity. The IM3 products that may fall into the desired band are those at the frequencies $(2 \cdot f_2 - f_1)$ and $(2 \cdot f_1 - f_2)$.

As a specific example, assume $f_1=880$ MHz, $f_2=881$ MHz, and $f_d=882$ MHz. The second-order nonlinearity of the active circuit generates IM2 products appearing at $(f_2-f_1)=1$ MHz, $(2 \cdot f_1)=1760$ MHz, $(2 \cdot f_2)=1762$ MHz, and $(f_2+f_1)=1761$ MHz. Some of these IM2 products mix with the original undesired signals to produce IM3 products at the desired signal frequency $f_d$. Specifically, the IM2 product at $(f_2-f_1)$ mixes with the undesired signal at $f_2$ to generate the IM3 product at $(f_2-f_1)+f_2=882$ MHz, and the IM2 product at $(2 \cdot f_2)$ mixes with the undesired signal at $f_1$ to generate the IM3 product at $(2 \cdot f_2)-f_1=882$ MHz. The third-order nonlinearity of the active circuit also generates an IM3 product at $(2 \cdot f_2-f_1)=882$ MHz. As shown in FIG. 1A, three IM3 products $(f_2-f_1)+f_2$, $(2 \cdot f_2)-f_1$, and $(2 \cdot f_2-f_1)$ fall within the desired signal band.

The total amplitude of the combined IM3 product at the desired signal frequency $f_d$ depends on the magnitudes and phases of the individual IM3 products. In the worst case, all IM3 products have the same phase and add constructively, resulting in the maximum possible interfering signal (i.e., the largest IM3 distortion) at the desired frequency. The interfering signal behaves as noise that degrades the performance of the system in which the active circuit is used.

As can be seen, techniques that reduce the amplitude of the interfering IM3 products are highly desirable, especially in communications systems.

SUMMARY OF THE INVENTION

The invention provides techniques to reduce intermodulation distortion at the output of an active circuit having even-order and odd-order nonlinearities. Specifically, the IM3 products generated by the even-order nonlinearity of the active circuit are canceled against the IM3 products generated by the odd-order nonlinearity. The amplitude and phase of the IM3 products can be manipulated by adjusting either the source or load impedance, or both, of the active circuit. The amplitude and phase of the IM2 products generated by the even-order nonlinearity can be manipulated by adjusting the source or load impedance, or both impedances, of the active circuit at sub-harmonic (Δf) and second harmonic (2f) frequencies (i.e., the frequencies of the IM2 products). The amplitude and phase of the IM3 products generated by the odd-order nonlinearity can be manipulated by adjusting the source and/or load impedance of the active circuit at the fundamental frequency (f). By properly tuning or "matching" the impedance of either the source or load, or both, of the active circuit at either the sub-harmonic or second harmonic frequency, or both, the amplitude and phase of the IM2 products can be adjusted such that the IM3 products inside the desired signal band resulting from the even-order nonlinearity (ideally) cancel the IM3 product(s) resulting from the odd-order nonlinearity to a high degree. Alternatively, by properly matching the impedance of the source or load, or both, of the active circuit at the fundamental frequency, the amplitude and phase of the IM3 products inside the desired signal band resulting from the odd-order nonlinearity can be adjusted to cancel the IM3 products resulting from the even-order nonlinearity.

A specific embodiment of the invention provides an electronic circuit that comprises an active circuit and at least one matching network. The active circuit includes an input that couples to a signal source and an output that couples to a load. The active circuit has even-order nonlinearity and odd-order nonlinearity and is configured to operate on an input signal including a desired signal centered at a first frequency and undesired signals centered at a second frequency. The matching network is coupled either between the signal source and the input of the active circuit or between the load and the output of the active circuit. The matching network is tuned at either a sub-harmonic frequency or a second harmonic of the second frequency, or at both frequencies, to reduce intermodulation distortion. The matching network is tuned to reduce intermodulation distortion by canceling the intermodulation products resulting from even-order nonlinearity with intermodulation products resulting from odd-order nonlinearity. In an embodiment, the active circuit is a transistor.

Another specific embodiment of the invention provides a method for reducing intermodulation distortion from an active circuit that operates on an input signal including a desired signal centered at a first frequency and undesired signals centered at a second frequency. In accordance with the method, the load and source impedances of the active circuit are determined. The active circuit is then modeled with a nonlinear model having an input and an output. The model input couples to the source impedance and the model output couples to the load impedance. A first matching network is defined and coupled between either the model input and the source impedance or the model output and the load impedance. Intermodulation distortion resulting from the active circuit are then computed for one or more impedance values of the first matching network, with the impedance values computed at either a sub-harmonic frequency or a second harmonic of the second frequency. The impedance value for the first matching network that reduces the intermodulation distortion is selected.

In the embodiments described above, a second matching network can also be provided. In this case, one matching network is coupled to the input of the active circuit and the other matching network is coupled to the output of the active circuit.

The foregoing, together with other aspects of this invention, will become more apparent when referring to the following specification, claims, and accompanying drawings.

DESCRIPTION OF THE SPECIFIC EMBODIMENTS

In cellular telephone applications, it is common to have more than one communications system operating within a particular geographic coverage area. Moreover, these systems can operate at or near the same frequency band. When this occurs, the transmission from one system can cause degradation in the received signal of another system. These communications systems may include Code Division Multiple Access (CDMA), Time Division Multiple Access (TDMA), GSM, AMPS, and frequency modulation (FM) communications systems.

CDMA is a spread spectrum communications system that spreads the transmit power to each user over an entire (e.g., 1.2288 MHz) signal bandwidth. The spectral response of an FM-based transmission is typically more concentrated at the center frequency. Therefore, FM-based transmission can cause "jammers" to appear very close in frequency to the received CDMA signal. Furthermore, the amplitude of the jammers can be many times greater than that of the CDMA signal. These jammers can result in third-order intermodulation (IM3) products caused by nonlinearity of the amplifiers within the receiver. The IM3 products may fall within the band of the received CDMA signal and behave as noise that degrades the performance of the CDMA system.

Figure 1A:
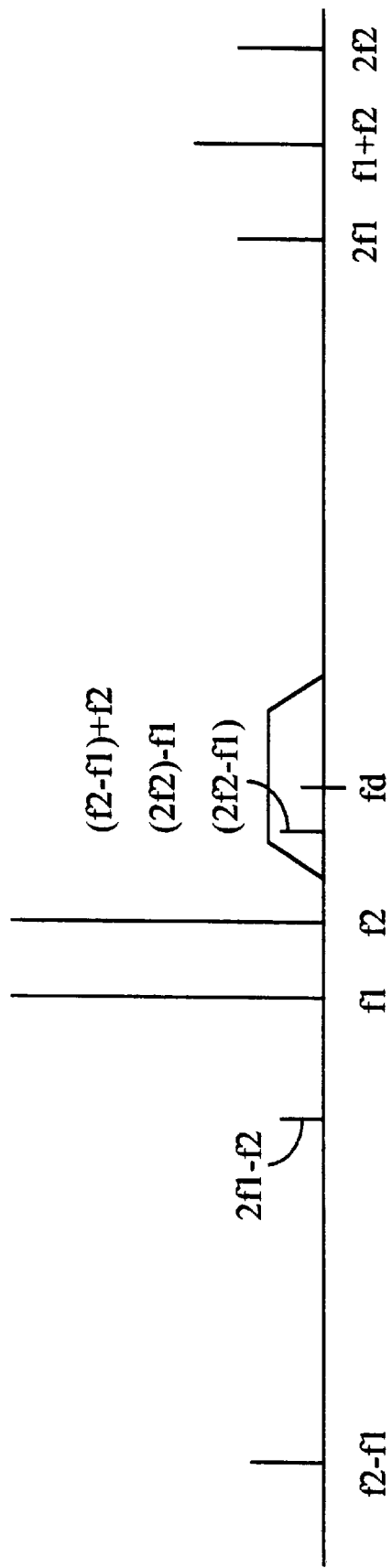
FIG. 1A is a diagram illustrating an input RF signal and the intermodulation products.

As shown in FIG. 1A, the jammers can be located close to the frequency of the desired signal, making it difficult to filter out the jammers. To compound the problem, the amplitudes of the IM3 products are scaled by $g_1 \cdot g_2^2$ and $g_1^2 \cdot g_2$ (see equations (1) and (2)). Thus, every doubling of the amplitude of the jammers produces an eight-fold increase in the amplitude of the IM3 products. Viewed another way, every 1 dB increase in the input power of the jammers results in 3 dB increase in the IM3 products.

Figure 1B:
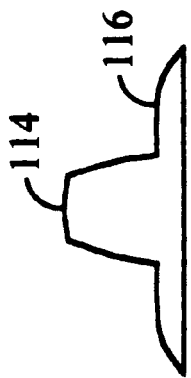
FIG. 1B is a diagram illustrating the generation of IM3 distortion, due to nonlinearity in the active circuit, resulting from the desired signal itself.
Figure 1B:
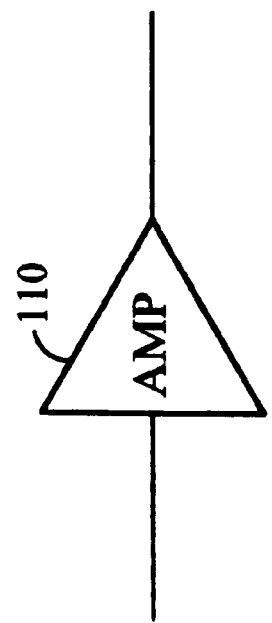
Figure 1B:
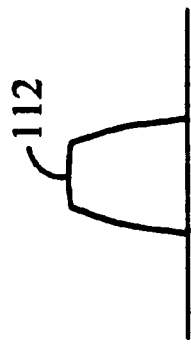

FIG. 1B is a diagram illustrating the generation of IM3 distortion (also referred to as spectral regrowth) due to nonlinearity in the active circuit. The IM3 distortions in FIG. 1B results from the desired signal itself, without any jammers. In FIG. 1B, the input signal into an amplifier 110 is, for example, a CDMA signal 112. The output signal from amplifier 110 is the amplified CDMA signal 114 and a distortion component 116. The distortion component 116 acts as interference on CDMA signal 114 and on the adjacent channels. Thus, it is desirable to reduce the amplitude of the distortion component 116.

Figure 1C:
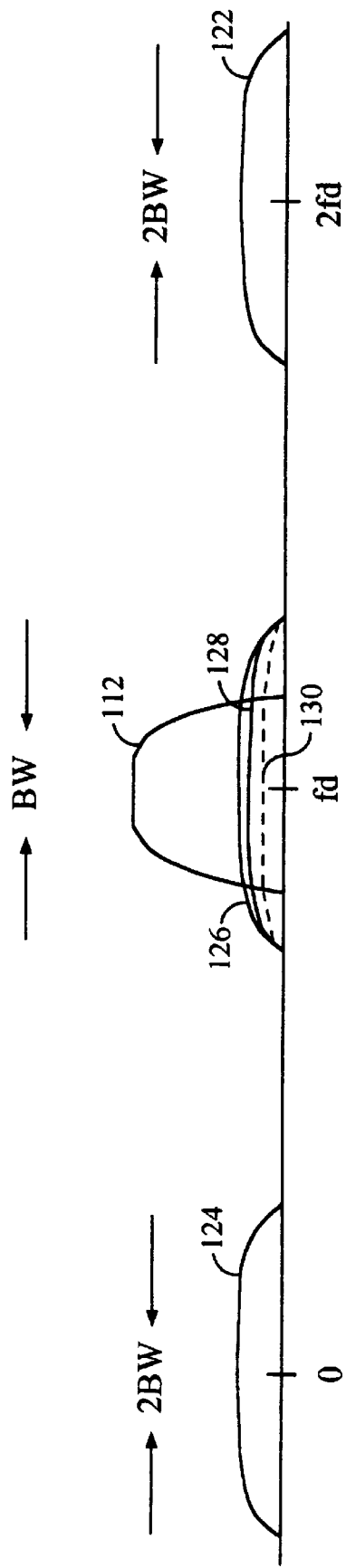
FIG. 1C is a diagram illustrating the generation of the intermodulation products shown in FIG. 1B.

FIG. 1C is a diagram illustrating the generation of the intermodulation products shown in FIG. 1B. Due to second-order nonlinearity in the amplifier, the desired signal 112 centered around $f_d$ results in IM2 distortion components 122 at the second harmonic frequency centered around $2f_d$ and distortion components 124 at the difference frequency centered around DC. Note that the bandwidth of the distortion components 122 and 124 is twice that of the desired signal 112. The distortion components 122 then mixes with the desired signal 112 to generate distortion components 126 at the difference frequency ($2f_d-f_d$) due to the same second-order nonlinearity in the amplifier. The distortion components 124 also mixes with the desired signal 112 to generate distortion components 128 at the sum frequency ($0+f_d$) due to the second-order nonlinearity. Distortion components 130 results from the third-order nonlinearity in the amplifier and are generated from the desired signal 112. Note that the bandwidth of the distortion components 126, 128, and 130 is three times that of the desired signal 112.

The linearity of an active circuit can be characterized by the input-referred third-order intercept point (IIP3). Typically, the output RF signal and the third-order intermodulation products are plotted versus the input RF signal. As the input RF signal is increased, the IIP3 is a theoretical point where the desired output RF signal and the IM3 products become equal in amplitude. The IIP3 is an extrapolated value since the active circuit typically goes into compression before the IIP3 point is reached. To minimize degradation due to intermodulation products, the active circuit is designed to have high IIP3.

As noted above, for a pair of jammers at the frequencies $f_1$ and $f_2$, the second-order nonlinearity of the active circuit produces IM2 products at the upper frequencies (e.g., $(2 \cdot f_1)$, $(2 \cdot f_2)$, and $(f_1+f_2)$) and the difference frequency (e.g., $(f_2-f_1)$). The amplitudes and phases of the IM2 products are dependent, in part, on the impedances of the source and load of the active circuit at the upper and difference frequencies. The IM2 products produced by the nonlinear input impedance of the active circuit and the IM2 products fed back to the input of the active circuit are mixed with the jammers to generate IM3 products that may fall within the desired signal band. Additionally, the third-order nonlinearity of the active circuit also creates IM3 products that may also fall within the desired signal band. The amplitudes and phases of the IM3 products from the third-order nonlinearity are dependent, in part, on the impedances of the source and load of the active circuit at the frequencies of these IM3 products.

The invention provides techniques to cancel the IM3 products at the output of the active circuit. Specifically, the IM3 products generated by the even-order (i.e., second-order) nonlinearity of the active circuit are canceled, at a particular frequency, against the IM3 products generated by the odd-order (i.e., third-order) nonlinearity. The amplitude and phase of the IM3 products can be manipulated by adjusting either the source or load impedance, or both, of the active circuit.

Figure 2:
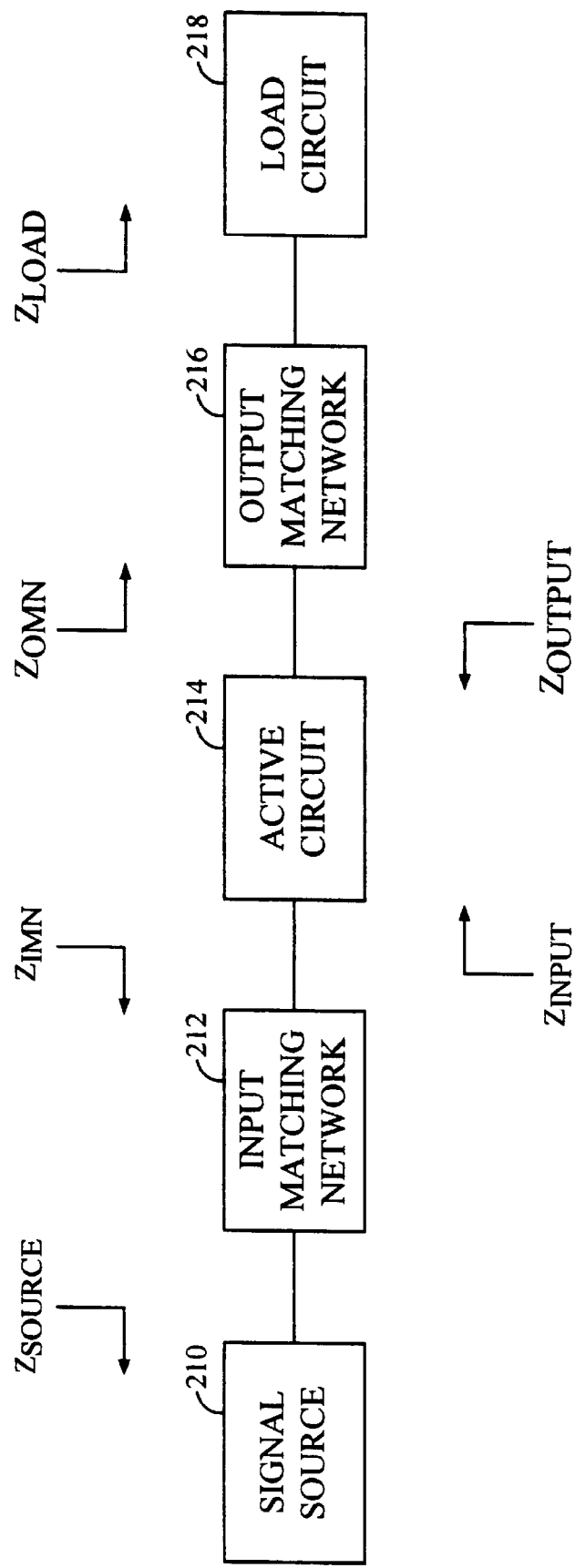
FIG. 2 shows a diagram of a circuit configuration employing the impedance matching technique of the invention to reduce intermodulation distortion.

FIG. 2 shows a diagram of a circuit configuration employing the impedance matching technique of the invention to reduce intermodulation distortion. As shown in FIG. 2, a signal source 210 provides an input signal that includes a desired signal and (in most instances) undesired signals. Signal source 210 couples via an input matching network 212 to an active circuit 214. Active circuit 214 couples via an output matching network 216 to a load circuit 218. Active circuit 214 can be any circuit that exhibits nonlinearity, such as an active device, a low noise amplifier (LNA), or a power amplifier (PA) fabricated in any available semiconductor process.

The invention can be practiced in one of many embodiments. In one embodiment, a matching network is placed at the input of the active circuit. In another embodiment, a matching network is placed at the output of the active circuit. And in yet another embodiment, matching networks are placed at both the input and output of the active circuit. In one specific application for a receiver system, the matching network is placed at the input of a low noise amplifier (LNA) to reduce the amplitude of the intermodulation products before amplification is performed. In another specific application for a transmitter system, the matching network is placed at the output of the active circuit that introduces the intermodulation, such as the amplifier.

As shown in FIG. 2, signal source 210 has a source impedance ($Z_{source}$) and load circuit 218 has a load impedance ($Z_{load}$). Input matching network 212 transforms the source impedance ($Z_{source}$) into an input matching network impedance ($Z_{imn}$) at the input of active circuit 214 that reduces intermodulation distortion at the output of active circuit 214. Similarly, output matching network 216 transforms the load impedance ($Z_{load}$) into an output matching network impedance ($Z_{omn}$) at the output of active circuit 214 that also reduces intermodulation distortion at the output of active circuit 214. The design of matching networks 212 and 216 is further described below.

Figure 3A:
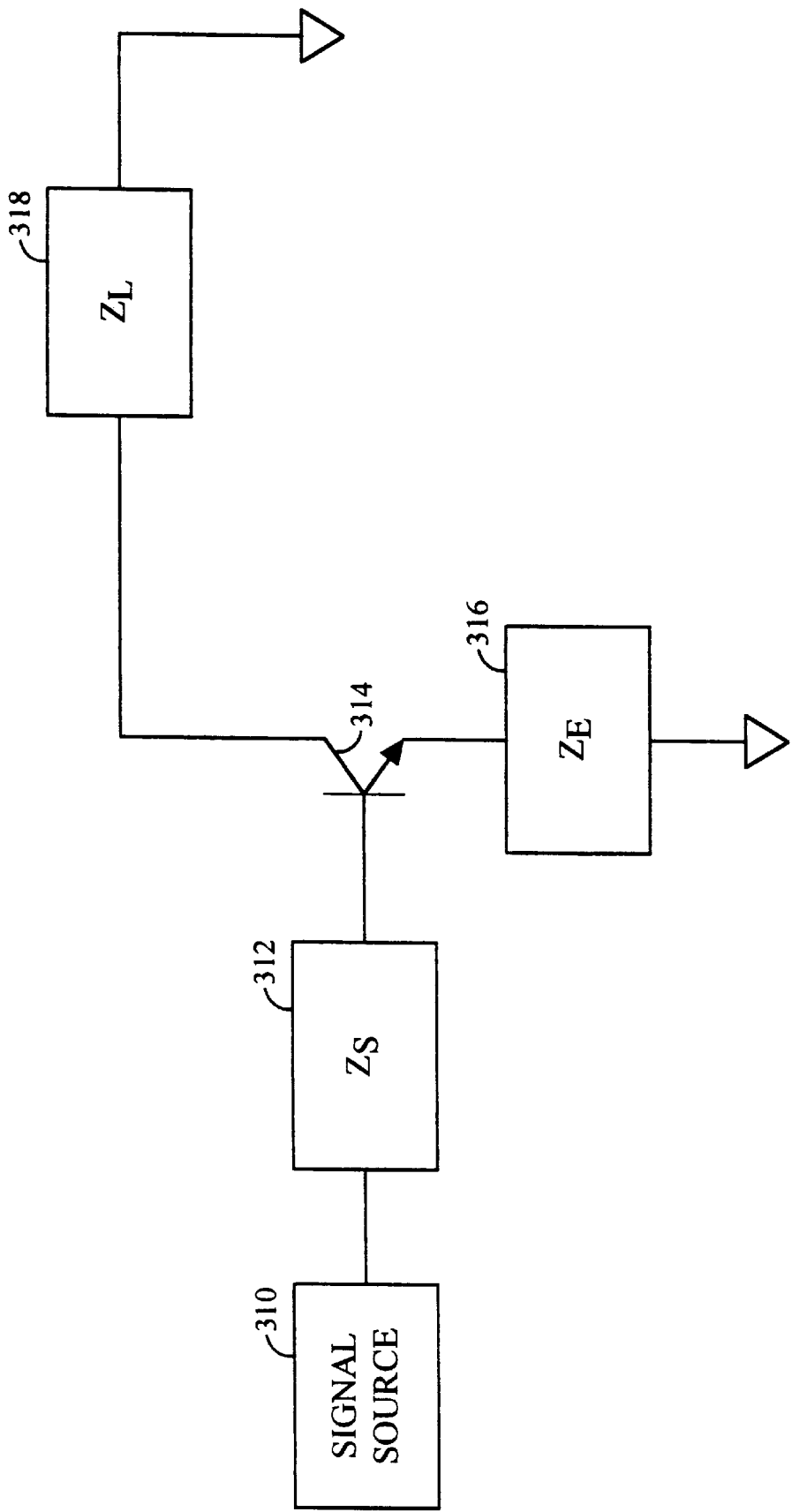
FIG. 3A shows a diagram of an embodiment of a common-emitter amplifier.

FIG. 3A shows a diagram of an embodiment of a common-emitter amplifier. A signal source 310 couples to the base of a bipolar junction transistor 314 via a network 312 having an impedance of $Z_S$. The emitter of transistor 314 couples to a network 316 having an impedance of $Z_E$. And the collector of transistor 314 couples to a network 318 having an impedance of $Z_L$. Network 312 includes the impedance of the signal source and the matching and bias networks for the input of the active circuit. Network 318 includes the impedance of the load and the matching and bias networks for the output of the active circuit.

Figure 3B:
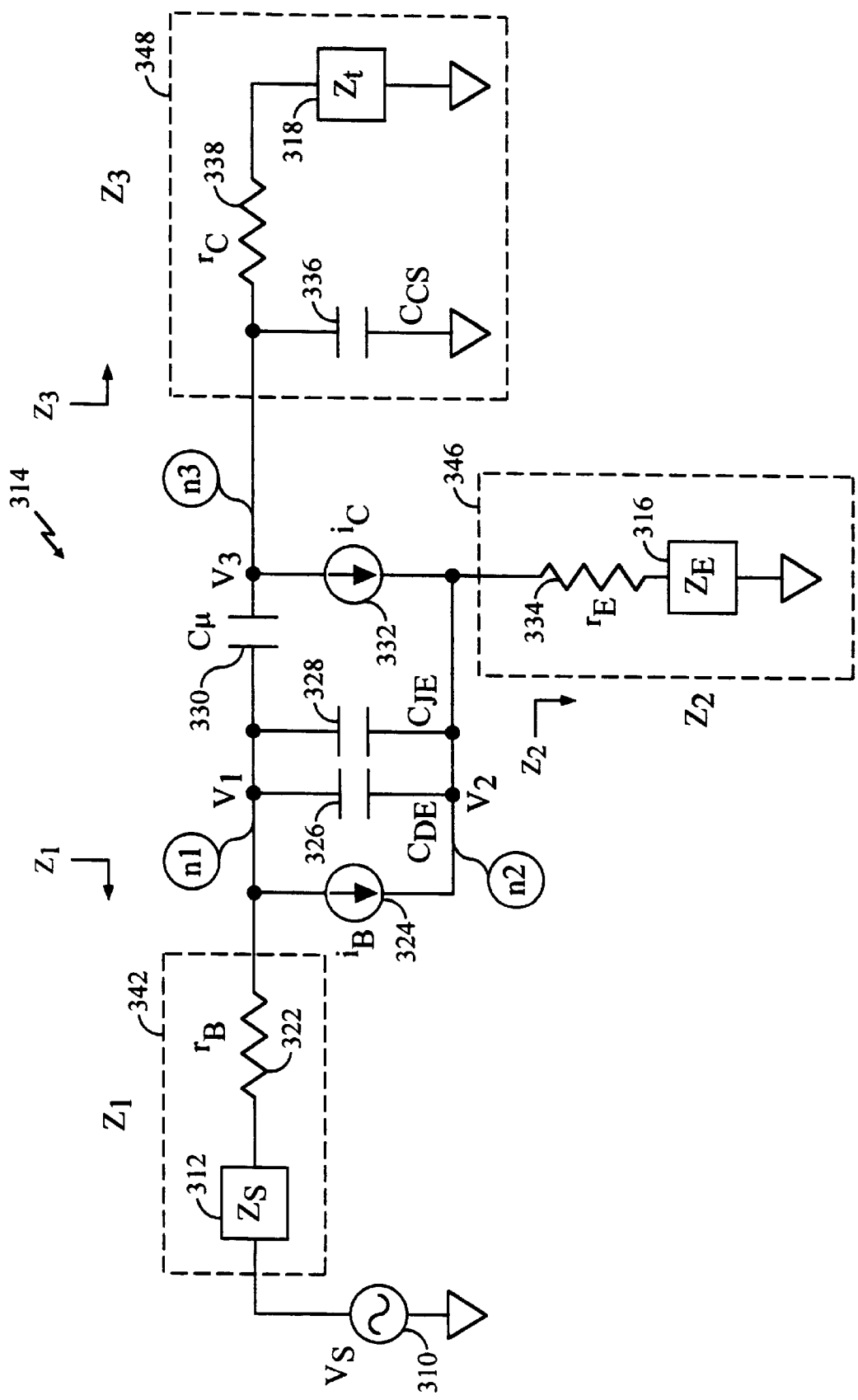
FIG. 3B shows a schematic diagram of an equivalent circuit of the common-emitter amplifier in FIG. 3A.

FIG. 3B shows a schematic diagram of an equivalent circuit of the common-emitter amplifier in FIG. 3A. Signal source 310 and networks 312, 316, and 318 are shown again in FIG. 3B. Transistor 314 is biased in the forward active region and is modeled as a nonlinear AC equivalent circuit.

In the equivalent circuit, a base resistor ($r_B$) 322 couples between network 312 and a node $n_1$. A current source ($i_B$) 324 couples in parallel with a base-emitter diffusion capacitor ($C_{DE}$) 326 and an emitter-base junction capacitor ($C_{jE}$) 328, the combination of which couples between nodes $n_1$ and $n_2$. A base-collector junction capacitor ($C_\mu$) 330 couples between nodes $n_1$ and $n_3$. A collector current source ($i_C$) 332 couples between nodes $n_2$ and $n_3$. An emitter resistor ($r_E$) 334 couples between node $n_3$ and network 316. A collector-substrate capacitor ($C_{CS}$) 336 couples between node $n_1$ and circuit ground. A collector resistor ($r_C$) 338 couples between node $n_3$ and network 318. Network 312 and resistor ($r_B$) 322 together form a network 342 having an impedance of $Z_1$, as seen from node $n_1$. Network 316 and resistor ($r_E$) 334 together form a network 346 having an impedance of $Z_2$, as seen from node $n_2$. And network 318, capacitor ($C_{CS}$) 336, and resistor ($r_C$) 338 together form a network 348 having an impedance of $Z_3$, as seen from node $n_3$.

In the small-signal analysis, the collector current ($i_C$) of current source 332 is given by the following equation:

$$i_C = g_1 \cdot v_\pi + g_2 \cdot v_\pi^2 + g_3 \cdot v_\pi^3 + \ldots, \quad \text{Eq (3)}$$

where $v_\pi$ is the internal base-emitter voltage ($v_\pi = v_1 - v_2$) and $g_1$, $g_2$, and $g_3$ are coefficients of a power series defining $i_C$. As shown in equation (3), the collector current $i_C$ does not depend on the base-collector voltage ($v_1-v_3$). This assumption is valid for a transistor that operates far from the saturation and breakdown regions. The output resistance of the transistor itself $r_O$, modeling the Early effect, can be ignored in instances where it is much larger than the load impedance ($Z_L$), which is the case for most RF circuits.

In the following analysis, the following simplifications are made. First, only the first three terms in equation (3) are analyzed and the higher order terms in the power series are ignored. This simplification is valid for circuits that are weakly nonlinear (i.e., operating with small signals). Second, the base resistance ($r_B$) is presumed to be constant, which is accurate if the real part of $Z_S$ is much larger than $r_B$ (Re{$Z_S$}>>$r_B$). Third, the base-emitter junction capacitance ($C_{jE}$) is also presumed to be constant, which is a plausible assumption because of the relatively weak dependency of $C_{jE}$ on the bias voltage. Fourth, the base-collector capacitance ($C_\mu$) and the collector-substrate capacitance ($C_{CS}$) are presumed to be constant, which is a valid assumption if the base-collector and collector-substrate junctions are strongly reverse-biased. And fifth, the low frequency current gain ($\beta$) and the forward transit time ($\tau$) are also presumed to be constant. The assumption of constant $\beta$ and $\tau$ narrows the accuracy of the analysis to instances where the collector bias current is below the levels causing the high-level injection and the $f_T$ roll-off effect. Constant $\beta$ and $\tau$ cause the base current ($i_B$) and the current ($i_{CDE}$) through the base-emitter diffusion capacitance ($C_{DE}$) to be linear functions of the nonlinear collector current ($i_C$)

$$\left(\text{e.g., } i_B = \frac{i_C}{\beta} \text{ and } i_{C_{DE}} = \tau \cdot \frac{d i_C}{d t}\right).$$

With these simplifications, the analysis begins by finding the IM3 distortion of the signal delivered to the load ($Z_L$). Since the voltage at node $n_3$ has the same distortion as that at the load, the distortion at the load can be determined from the Volterra series for the voltage at node $n_3$, which is:

$$v_3(v_S) = B_1(\omega_1) \cdot v_S + B_2(\omega_1, \omega_2) \cdot v_S^2 + B_3(\omega_1, \omega_2, \omega_3) \cdot v_S^3 + \ldots \quad \text{Eq (4)}$$

where $B_n(\omega_1, \ldots, \omega_n)$ is the n-dimensional Fourier transform of the n-th order Volterra kernel. For an input signal ($v_S$) including two tones at the frequencies $f_a$ and $f_b$ (i.e., $v_S = |v_S| \cdot [\cos(\omega_a t) + \cos(\omega_b t)]$), the IM3 product at the frequency ($2 \cdot f_b - f_a$) is given by:

$$IM3(2\omega_b - \omega_a) = \frac{3}{4} \cdot \left| \frac{B_3(\omega_b, \omega_b, -\omega_a)}{B_1(\omega_a)} \right| \cdot |v_S|^2. \quad \text{Eq (5)}$$

The coefficients of the $v_3(v_S)$ power series in equation (4) (e.g., $B_1(\ )$, $B_2(\ )$, $B_3(\ )$, …) can be found from Kirchoff's law equations in the manner known in the art. For example, this derivation is described by Fong, K. L. and Meyer, R. G. in a paper entitled "High-Frequency Nonlinearity Analysis of Common-Emitter and Differential-Pair Transconductance Stages," *IEEE Journal on Solid-State Circuits*, vol. 33, pages 548–555, April 1998. Once these coefficients are obtained, they are substituted into equation (5) to yield the following:

$$IM3(2\omega_b - \omega_a) \cong \frac{3}{4} \cdot |H(\omega)| \cdot |A_1(\omega)|^3 \cdot |\varepsilon(\Delta\omega, 2\omega)| \cdot |v_S|^2. \quad \text{Eq (6)}$$

$H(\omega)$ relates the equivalent input IM3 voltage to the IM3 components of the collector current, and is given by:

$$|H(\omega)| = \frac{1 + j\omega C_{jE}[Z_1(\omega) + Z_2(\omega)] + j\omega C_\mu Z_1(\omega)\left(1 + \frac{1}{\beta} + j\omega\tau\right)}{g_1 - j\omega C_\mu \left[1 + Z_2(\omega)\left(g_1 + \frac{g_1}{\beta} + j\omega\tau g_1 + j\omega C_{jE}\right)\right]}. \quad \text{Eq (7)}$$

$A_1(\omega)$ is the first-order transfer function relating $v_\pi$ to $v_S$, and is given by:

$$A_1(\omega) = \frac{1}{g_1 + g(\omega)} \cdot \frac{1 + j\omega C_\mu Z_3(\omega)}{\left(\frac{1}{\beta} + j\omega\tau\right)[Z_1(\omega) + Z_x(\omega)] + Z_x(\omega)}, \quad \text{Eq (8)}$$

$\varepsilon(\Delta\omega, 2\omega)$ is the interaction factor resulting from multiple IM3 contributions, and is given by:

$$\varepsilon(\Delta\omega, 2\omega) = g_3 - \frac{2g_2^2}{3}\left[\frac{2}{g_1 + g(\Delta\omega)} + \frac{1}{g_1 + g(\Delta 2\omega)}\right], \quad \text{Eq (9)}$$

$g(\omega)$ relates to the n-th order $i_C$ responses to the same order $v_\pi$ responses with $v_S = 0$ at the corresponding frequencies, and is given by:

$$g(\omega) = \frac{1 + j\omega C_\mu[Z_1(\omega) + Z_3(\omega)] + j\omega C_{jE}[Z_1(\omega) + Z_x(\omega)]}{\left(\frac{1}{\beta} + j\omega\tau\right)[Z_1(\omega) + Z_x(\omega)] + Z_x(\omega)}. \quad \text{Eq (10)}$$

where $\omega \approx \omega_a \approx \omega_b$, $\Delta\omega = \omega_b - \omega_a$, and $Z_x = Z_2 + j\omega C_\mu(Z_1 Z_2 + Z_1 Z_3 + Z_2 Z_3)$. The derivation of equations (4) through (10) is further described in the aforementioned U.S. provisional Application Ser. Nos. QCPA729P and QCPA730P.

In equation (9), the first term ($g_3$) comes from the third-order nonlinearity of the collector current (as shown in equation 3), and the second term $[(2g_2^2/3)(\ldots)]$ comes from the second-order nonlinearity of the collector current. The second term reflects the IM3 products generated from IM2 products mixing with the input tones.

The derived closed-form expression for the IM3 product in equation (6) includes the collector-base junction capacitance ($C_\mu$). This capacitor affects the amount of distortion generated by the transistor. Capacitor ($C_\mu$) feeds the IM2 products from the collector back to the base where they mix with the input tones to generate the IM3 products. As shown in equation (6), lower IM3 distortion is achieved when the factors $|H(\omega)|$, $|A_1(\omega)|$, and $|\varepsilon(\Delta\omega, 2\omega)|$ are reduced. The first two factors are functions of $\omega$ and depend on the in-band source and load impedances (i.e., the impedances at $\omega$). The in-band impedances are typically optimized for other performance considerations, i.e., they are selected to provide the required gain, noise figure, input/output impedance match, and so on. Accordingly, in an embodiment of the invention, the in-band impedance at $\omega$ is not tuned to reduce IM3 distortion.

As shown in equation (9), $\varepsilon(\ )$ is a function of $g(\ )$ which is a function of $Z_1$, $Z_2$, and $Z_3$. Referring to FIG. 3B, $Z_1$ is a combination of $Z_S$ and $r_B$, $Z_2$ is a combination of $Z_E$ and $r_E$, and $Z_3$ is a combination of $Z_L$, $r_C$, and $C_{CS}$. $Z_E$ is generally fixed and is usually not considered in the optimization for reducing IM3 distortion.

In accordance with an aspect of the invention, the impedances ($Z_1$ and $Z_3$) that result in the "optimal" distortion performance are first determined. Then, the "optimal" source and load impedances ($Z_S$ and $Z_L$) can be computed based on the determined impedances ($Z_1$ and $Z_3$) and the components $r_B$, $r_C$, and $C_{CS}$, which are known from the signal model or can be empirically measured. The following discussion refers to the source and load impedances $Z_S$ and $Z_L$ that are related to impedances $Z_1$ and $Z_3$, respectively.

As shown in equations (9) and (10), the interaction factor $|\varepsilon(\Delta\omega, 2\omega)|$ is dependent on the source and load impedances at the difference (or sub-harmonic) frequency ($\Delta\omega = \omega_1 - \omega_2$) and the upper (or second harmonic) frequency ($2\omega$). As used herein, sub-harmonic refers to the difference frequency (i.e., $\Delta\omega$ or $\Delta f$) mixing products. In an embodiment of the invention, the impedances at these frequencies are optimized to reduce the factor $|\epsilon(\Delta\omega, 2\omega)|$, and thus the IM3 distortion. The parameters that can be optimized are: (1) the collector load impedance at the sub-harmonic frequency, or $Z_L(\Delta\omega)$; (2) the collector load impedance at the second harmonic frequency, or $Z_L(2\omega)$; (3) the base source impedance at the sub-harmonic frequency, or $Z_S(\Delta\omega)$; and (4) the base source impedance at the second harmonic frequency, or $Z_S(2\omega)$.

The minimum IM3 distortion can be obtained by setting equation (9) to zero and solving for the impedances for $Z_L(\Delta\omega)$, $Z_L(2\omega)$, $Z_S(\Delta\omega)$, and $Z_S(2\omega)$. This is a complex equation having many solutions. The optimization for the impedances that result in the minimum IM3 distortion can be achieved through computer simulations, numerical analysis, hand calculations, and other circuit analysis techniques.

To simplify the optimization process, either the source or load impedance of the active circuit can be fixed. In one embodiment, the load impedance of the active circuit is fixed and the source impedance of the active circuit is optimized at the sub-harmonic frequency and second harmonic frequency for minimum IM3 distortion using the equations derived above. In another embodiment, the source impedance of the active circuit is fixed and the load impedance of the active circuit is optimized at the sub-harmonic frequency and second harmonic frequency.

In one embodiment for determining the optimal source and load impedances, $|\epsilon(\Delta\omega, 2\omega)|$ is computed using equations (9) and (10) for various source and load impedance values. For example, a specific value is selected for the load impedance and $|\epsilon(\Delta\omega, 2\omega)|$ is computed for various source impedances. Then another specific value is selected for the load impedance and $|\epsilon(\Delta\omega, 2\omega)|$ is again computed for various source impedances. The results can be stored in a table, and the table can be searched for the best (i.e., lowest) value of $|\epsilon(\Delta\omega, 2\omega)|$. The process can be performed at the sub-harmonic frequency ($\Delta\omega$) and again at the second harmonic frequency ($2\omega$).

To further simplify the optimization process, several additional approximations can be made, which are described below. The first of these approximations neglects the effects of $Z_L(\Delta\omega)$. Theoretically, the load impedance at the out-of-band frequencies (e.g., $\Delta\omega$ and $2\omega$) affects the generation of the IM2 products resulting from the second-order nonlinearity of the transistor. These IM2 products are fed back to the input, via the collector-base junction capacitor ($C_\mu$), and mix with the input signal (again due to the second-order nonlinearity) to generate IM3 products. As shown by the example above, IM2 products at both the sub-harmonic (i.e., ($f_2-f_1$)) and second harmonic (i.e., ($2 \cdot f_2$)) frequencies mix with the input signal to generate IM3 products (i.e., at ($f_2-f_1$)+$f_2$ and ($2 \cdot f_2$)−$f_1$).

However, at the sub-harmonic frequency, the load impedance ($Z_L$) is typically much smaller than the impedance of the coupling capacitor ($C_\mu$) for many narrow-band RF circuits. Thus, the feedback through capacitor ($C_\mu$) at the sub-harmonic frequency ($\Delta\omega$) and the effect of $Z_L(\Delta\omega)$ can be neglected. This simplification is not accurate for circuits in which the collector current ($i_C$) significantly depends on the base-collector voltage ($v_3-v_1$). For these circuits, the IM2 product at the sub-harmonic frequency ($\Delta\omega$) in the collector voltage ($v_3$) modulates the output signal, thereby contributing to the IM3 distortion.

In many instances, the undesired signals can appear at any frequencies. Thus, a good design should not optimize for low IM3 distortion at any particular set of frequencies. From equation (9), to achieve zero theoretical distortion at different offset and center frequencies, $g(\Delta\omega)$ and $g(2\omega)$ should be frequency independent such that:

$$g(\Delta\omega) = \frac{1}{r}, \qquad \text{Eq (11A)}$$

$$g(2\omega) = \left(\frac{3g_3}{2g_2^2} - \frac{2r}{1+g_1 r}\right)^{-1} - g_1, \qquad \text{Eq (11B)}$$

where r is a constant to set $\epsilon(\Delta\omega, 2\omega)$ to zero. The expressions in equations (11A) and (11B) are under-determined and have many solutions. Among these solutions, those with positive real parts for $Z_L(2\omega)$, $Z_S(\Delta\omega)$, and $Z_S(2\omega)$ are readily realizable and are of interest.

Setting $\epsilon(\Delta\omega, 2\omega)$ equal to zero results in a zero IM3 product at the frequency ($2\omega_2-\omega_1$), but not necessarily a zero M3 product at the frequency ($2\omega_1-\omega_2$). The IM3 product at ($2\omega_1-\omega_2$) is related to $\epsilon(-\Delta\omega, 2\omega)$, which is not equal to $\epsilon(\Delta\omega, 2\omega)$ if $g(\Delta\omega) \neq g(-\Delta\omega)$. When this is the case, IM3($2\omega_1-\omega_2$)$\neq$IM3($2\omega_2-\omega_1$) and the condition is referred to as IM3 asymmetry. IM3 asymmetry prevents both IM3 products to be minimized concurrently. It can be shown that the dependency of $g(\Delta\omega)$ on the sign of $\Delta\omega$ is due to a non-zero imaginary part of $g(\Delta\omega)$ that changes the sign of $g(\Delta\omega)$ when $\Delta\omega$ is replaced with $-\Delta\omega$. Stated differently, $g(\Delta\omega)$ is conjugate to $g(-\Delta\omega)$. Thus, to avoid IM3 asymmetry, the imaginary part of $g(\Delta\omega)$ is set to zero, or Im$\{g(\Delta\omega)\}$=0, and r in equation (11A) should be real. This simplification further reduces the complexity of the optimization to reduce IM3 distortion.

For a clearer understanding of the invention and its application, the matching network for a specific LNA design is described.

Figure 4:
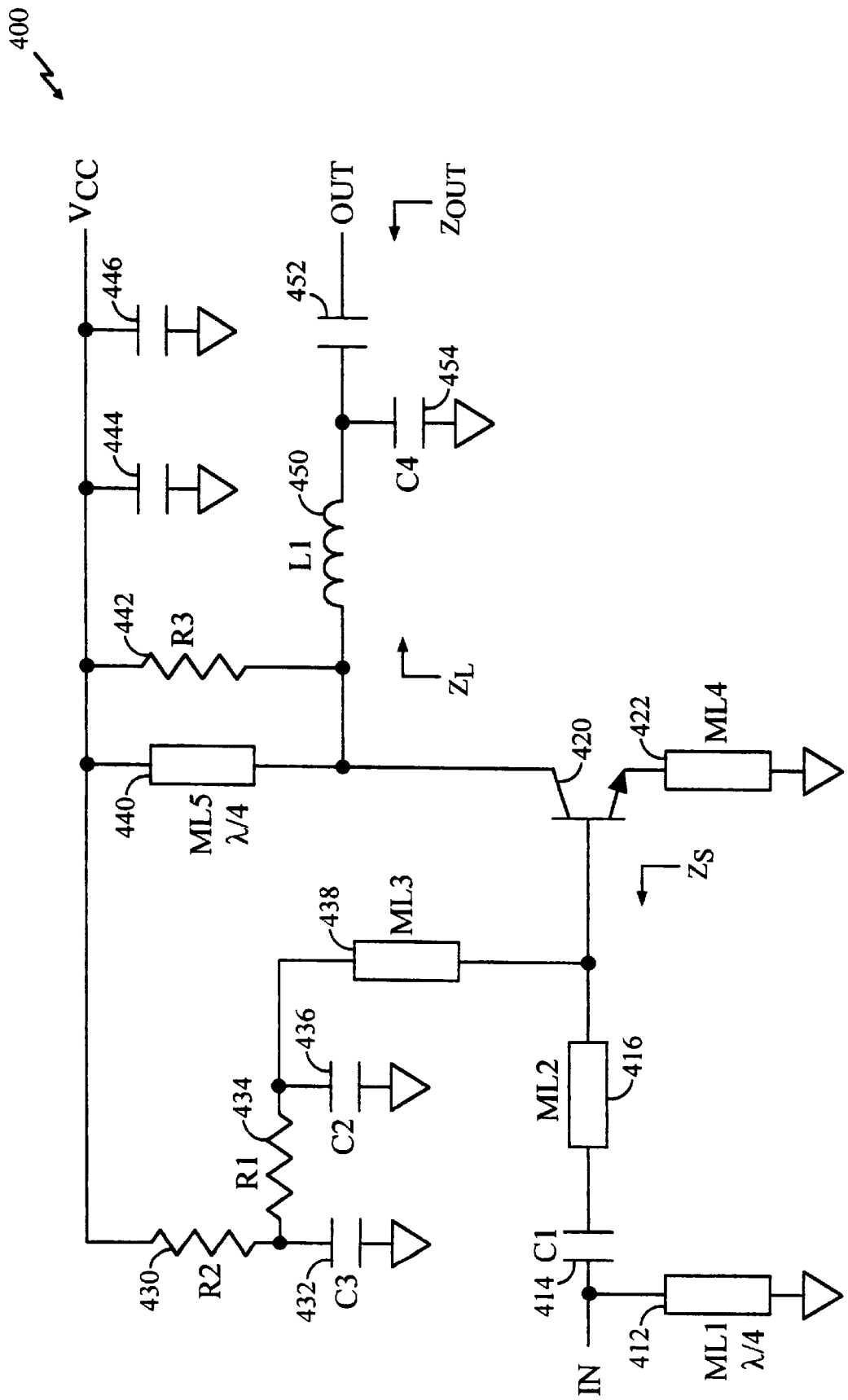
FIG. 4 shows a schematic diagram of a specific embodiment of a low noise amplifier (LNA) optimized for low IM3 distortion using the invention.

FIG. 4 shows a schematic diagram of a specific embodiment of a low noise amplifier (LNA) 400 optimized for low IM3 distortion using the invention. As shown in FIG. 4, a microstrip line 412 couples between the input of LNA 400 and circuit ground. A capacitor 414 couples in series with a microstrip line 416, the combination of which couples between the input of LNA 400 and the base of a transistor 420. A microstrip line 422 couples between the emitter of transistor 420 and circuit ground. A resistor 430 couples in series with a capacitor 432, the combination of which couples between the power supply ($V_{CC}$) and circuit ground. A resistor 434 couples in series with a capacitor 436, the combination of which couples in parallel with capacitor 432. A microstrip line 438 couples between the base of transistor 420 and capacitor 436. A microstrip line 440 couples in parallel with a resistor 442, the combination of which couples between the power supply ($V_{CC}$) and the collector of transistor 420. A pair of capacitors 444 and 446 couples between the power supply ($V_{CC}$) and circuit ground. An inductor 450 and a capacitor 452 couples in series, the combination of which couples between the collector of transistor 420 and the output of LNA 400. A capacitor 454 couples between circuit ground and the interconnection of inductor 450 and capacitor 452.

In an embodiment, transistor 420 is a discrete RF transistor from Philips Corporation (e.g., model number BFG425W) that is biased at 5 mA quiescent collector current from a 2.7V power supply ($V_{CC}$=2.7V). Capacitors 444 and 446 provide filtering of the power supply and an AC short for LNA 400. Resistors 430 and 434 set the bias current and also provide isolation of the power supply impedance. Typically, resistor 434 is much smaller than resistor 430 and minimally affects the bias current. Capacitor 432 provides AC ground for resistors 430 and 434. Capacitors 414 and 452 are AC coupling (i.e., DC blocking) capacitors. Resistor 434 and capacitor 436 set the source impedance at the sub-harmonic (i.e., $\Delta\omega$) frequency.

For simplicity, only the out-of-band source impedance ($Z_S$) is tuned for minimum IM3 distortion, or high IIP3 performance. Alternatively, the out-of-band load impedance ($Z_L$), or a combination of the source and load impedances, can be tuned for minimum IM3 distortion.

In one implementation, to isolate transistor 420 from the effects of the external load impedance at the second harmonic frequency, the collector load impedance ($Z_L(2\omega)$) is fixed (i.e., shorted to ground) by a short-circuited quarter wavelength microstrip line 440. This short isolates the (usually not well defined) second harmonic impedance of the external load from the collector of transistor 420. Line 440 is also used to provide the collector bias current. As stated above, the load impedance at the sub-harmonic frequency ($Z_L(\Delta\omega)$) can be neglected from consideration in most RF circuits because the impedance of line 440 is typically much less than that of the base-collector capacitor at the sub-harmonic frequency ($\Delta\omega$).

To isolate transistor 420 from the effects of the impedance of the signal source at the second harmonic frequency, the signal source is shorted to ground by a short-circuited quarter wavelength microstrip line 412. This short isolates the (typically undefined) second harmonic impedance of the signal source from the base of transistor 420. At the fundamental frequency ($\omega$), microstrip lines 412 and 440 act as open circuits and have minimal affects on the in-band performance of LNA 400.

By shorting the input of LNA 400 at the second harmonic frequency ($2\omega$), a well controlled non-zero real part of $Z_S(2\omega)$ can be produced using a resistor in the input matching network. However, this resistor tends to increase the noise figure (NF) of LNA 400 in the signal band. A network can be formed that provides the required resistance (i.e., the real value) at the second harmonic frequency ($2\omega$) and zero resistance at the fundamental frequency ($\omega$).

Alternatively, to avoid using resistors in the input matching network (i.e., to avoid degradation in the noise figure performance), $Z_S(2\omega)$ is limited to values having real parts that are close to zero. For a particular $Z_L(2\omega)$, together with the limitation imposed by equation (11B), constant r and the values of $Z_S(2\omega)$ at various second harmonic frequencies are defined. Once constant r is defined, equation (11A) can be solved for the optimal values of $Z_S(\Delta\omega)$ at the sub-harmonic frequencies.

Thus, the approximations and their basis are as follows:

| | |
|---|---|
| $Z_L(\Delta\omega) \cong 0$; | impedance of line 440 << base-collector capacitor impedance |
| $Z_L(2\omega) \cong 0$; | $\lambda/4$ microstrip line 440 |
| $\text{Im}\{g(\Delta\omega)\} \cong 0$; | assumed to achieve IM3 asymmetry |
| $\text{Re}\{Z_s(2\omega)\} \cong 0$; | no resistor in the input matching network |

In the embodiment shown in FIG. 4, the input matching network is designed to match the input of LNA 400 to 50$\Omega$ at the fundamental frequency (e.g., f$\approx$2 GHz), and to properly terminate the input at the sub-harmonic frequency (e.g., $\Delta$f<50 MHz) and at the second harmonic frequency (e.g., 2f$\approx$4 GHz) for reduced IM3 distortion and improved IIP3 performance.

Microstrip line 438 is used for in-band matching at the fundamental frequency (f), and its length is determined by shunt capacitor 436. The source impedance at the sub-harmonic frequency $Z_S(\Delta\omega)$ is set by resistor 434 in parallel with capacitor 436. At the sub-harmonic frequency, the effects of capacitor 414 and microstrip line 416 can be ignored since capacitor 414 is selected to have high impedance at this frequency. Varying the value of resistor 434 changes the real part of $Z_S(\Delta\omega)$. The source impedance at the second harmonic frequency $Z_S(2\omega)$ is set by microstrip line 416 in parallel with microstrip line 438. Varying the length of microstrip line 416 tunes the imaginary part of $Z_S(2\omega)$ without affecting the in-band impedance match because line 416 is a 50$\Omega$ line.

Inductor 450 and capacitor 454 form the output matching network that is used to tune the LNA output impedance at the fundamental frequency (f). Resistor 442 is used to stabilize LNA 400 and prevents oscillation. Microstrip line 422, together with the package lead and bondwire inductances of transistor 420, form the emitter degeneration circuit. This circuit brings the conjugate input impedance of the transistor closer to the source impedance that improves noise figure performance.

Figure 5:
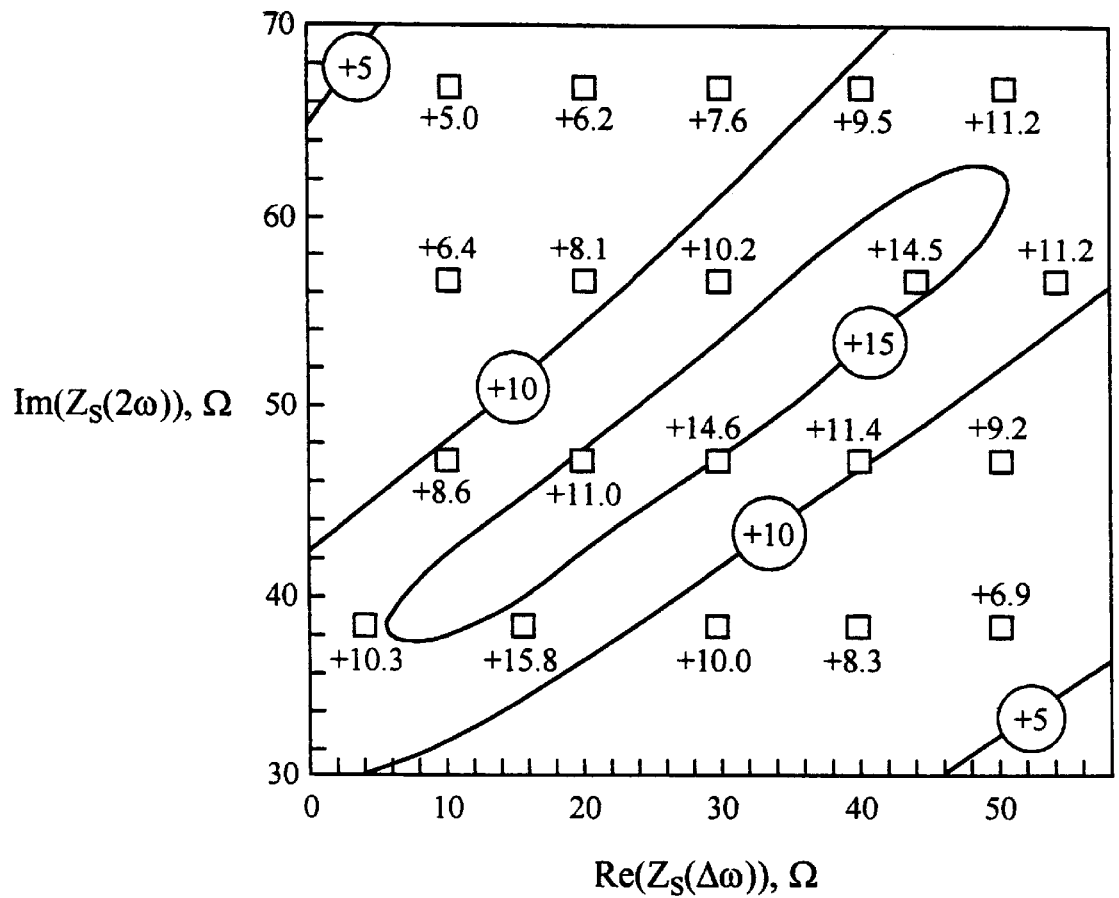
FIG. 5 is a plot of the IIP3 of the LNA as a function of the real part of $Z_S(\Delta\omega)$ and the imaginary part of $Z_S(2\omega)$.

FIG. 5 is a plot of the IIP3 (in dBm) of LNA 400 in FIG. 4 as a function of the real part of $Z_S(\Delta\omega)$ and the imaginary part of $Z_S(2\omega)$. In the example, the input signal include two tones at 2.000 GHz and 2.001 GHz. The contours are plotted using equation (6). The discrete data points represent the measured test results. The plot shows IIP3 that is the larger of IM3($2f_a - f_b$) and IM3($2f_b - f_a$). As shown in FIG. 5, the "optimal" combination of Re$\{Z_S(\Delta\omega)\}$ and Im$\{Z_S(2\omega)\}$ results in the best IIP3 performance of +15.8 dBm, which is 14 dB higher than the IIP3 for a similar LNA without the out-of-band impedance matching of the invention.

Figure 6A:
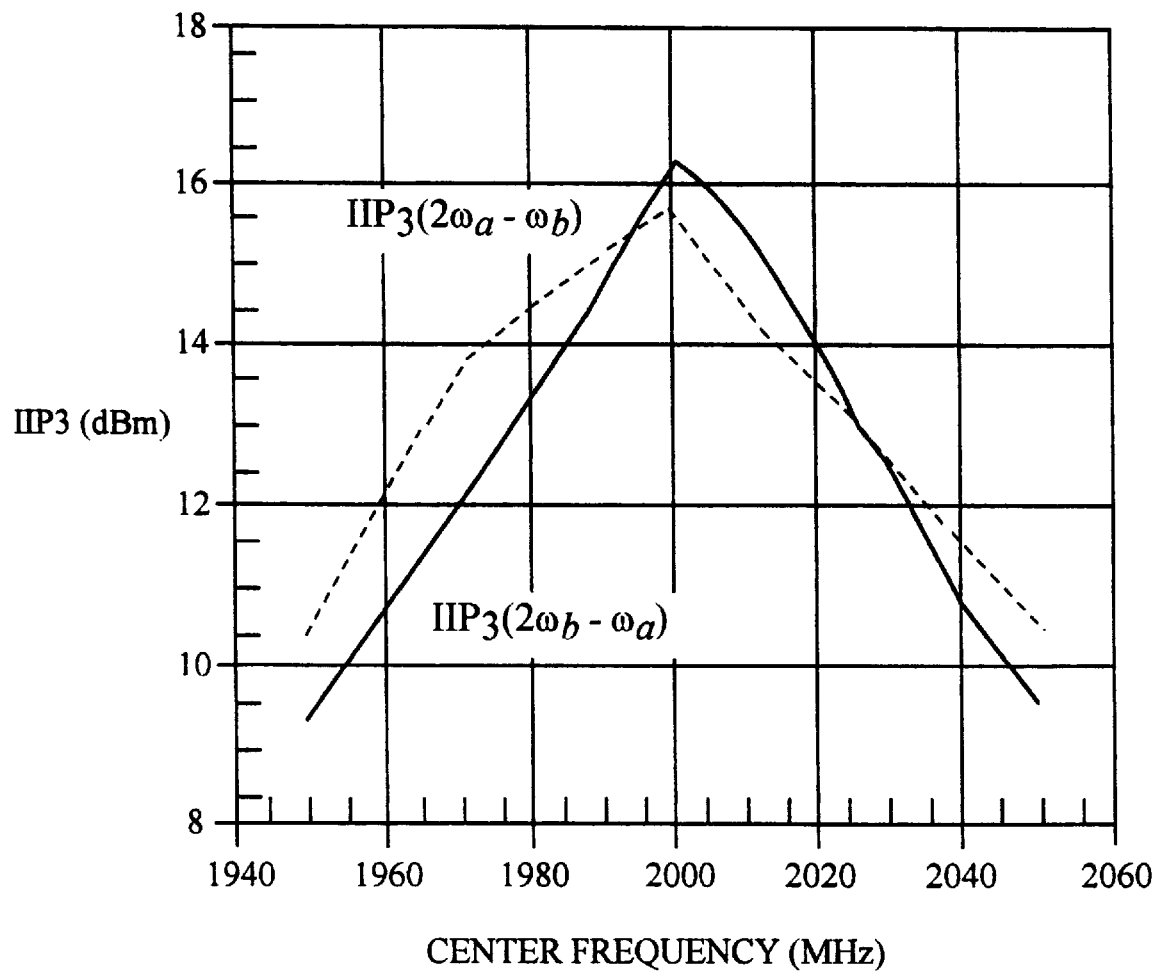
FIGS. 6A and 6B are plots that show the dependency of the IIP3 performance on the center frequency and the offset ($\Delta f$) frequency, respectively, of the input tones.
Figure 6B:
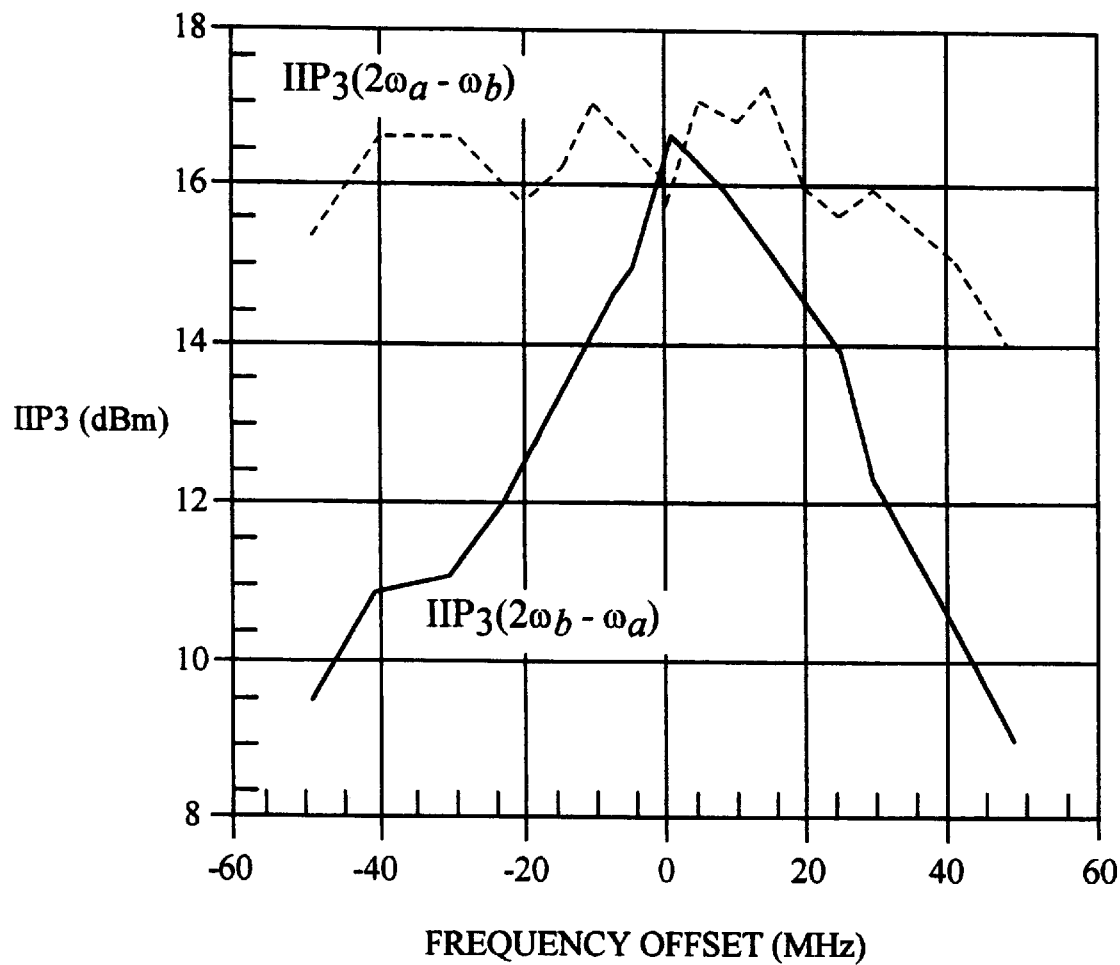

FIGS. 6A and 6B are plots that show the dependency of the IIP3 performance on the center frequency (f) and the offset ($\Delta$f) frequency, respectively, of the input tones. As shown in FIGS. 6A and 6B, for a frequency range of 1.95 GHz to 2.05 GHz and for a $\Delta$f range of $-50$ MHz to $+50$ MHz, the IIP3 performance is above +8 dBm. The dependency of IIP3 on frequency stems from the fact that $Z_S(\Delta\omega)$ and $Z_S(2\omega)$ are optimized only at a single offset and center frequency, which simplifies the optimization process. The matching network of the invention has negligible affects, if any, on other performance of LNA 400. The measured gain, noise figure, and input return loss are approximately 16 dB, 1.7 dB, and $-10$ dB, respectively, with and without the impedance matching of the invention. Thus, improvement in IIP3 performance is obtained without sacrificing performance of other important parameters.

The matching network in FIG. 4 is implemented using, in part, microstrip lines. Other transmission lines (e.g., microwave lines), lumped components (e.g., inductors and capacitors), or the like can also be used in the matching network and are within the scope of the invention.

For simplicity, the matching network has been optimized to reduce IM3 distortion at a specific set of frequencies. For improved linearity performance, the matching network should be optimized over a range of frequency ($\Delta$f) as determined by a band selection filter (i.e., the duplexer in a cellular transceiver).

For clarity, the invention has been described with the nonlinear circuits implemented as bipolar junction transistors (BJTs). The invention can also be applied to other nonlinear circuits including FETs, MOSFETs, MESFETs, HBTs, P-HEMTs, and others. As used herein, "transistor" generically refers to any nonlinear circuit, and is not limited to a BJT.

One aspect of the invention provides an electronic circuit (e.g., a LNA, a mixer, and other nonlinear circuits) that includes the matching networks of the invention. Another aspect of the invention provides software codes used to design the matching networks of the invention.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. An electronics circuit comprising:
   an active circuit including an input that couples to a signal source and an output that couples to a load, wherein the active circuit has even-order nonlinearity and odd-order nonlinearity and is configured to operate on an input signal from the signal source, wherein the input signal includes a desired signal centered at a first frequency and undesired signals centered at a second frequency; and
   a first matching network coupled between either the signal source and the input of the active circuit or the load and the output of the active circuit,
   wherein the first matching network is tuned at a sub-harmonic frequency or a second harmonic of the second frequency, or both, to reduce intermodulation distortion resulting from the even-order and odd order nonlinearities of the active circuit.

2. The circuit of claim 1 wherein the first matching network includes microstrip lines for tuning impedance.

3. The circuit of claim 1 wherein the first matching network includes lumped reactive circuits.

4. The circuit of claim 1 wherein the output of the active circuit is shorted at the second harmonic of the second frequency.

5. The circuit of claim 1 wherein the output of the active circuit is open circuited at the second harmonic of the second frequency.

6. The circuit of claim 1 wherein an output impedance of the signal source is shorted at the second harmonic of the second frequency.

7. The circuit of claim 1 wherein the first matching network is tuned to reduce intermodulation distortion by cancellation of intermodulation products resulting from even-order nonlinearity with intermodulation products resulting from odd-order nonlinearity.

8. The circuit of claim 1 wherein the first matching network is interposed between the signal source and the input of the active circuit.

9. The circuit of claim 1 wherein the first matching network is interposed between the load and the output of the active circuit.

10. The circuit of claim 1 further comprising:
    a second matching network interposed between the load and the output of the active circuit, and
    wherein the first matching network is interposed between the signal source and the input of the active circuit.

11. The circuit of claim 1 wherein the first matching network realizes a first complex value of impedance at the sub-harmonic frequency and a second complex value of impedance at the second harmonic of the first frequency that are selected to reduce intermodulation distortion.

12. The circuit of claim 1 wherein the first matching network has minimal effect on impedance at the first frequency.

13. A circuit for use as an amplifier or a mixer comprising:
    a transistor including a base that couples to a signal source and a collector that couples to a load, wherein the transistor has even-order nonlinearity and odd-order nonlinearity and is configured to operate on an input signal from the signal source, wherein the input signal includes a desired signal centered at a first frequency and undesired signals centered at a second frequency;
    a first matching network coupled between the signal source and the base; and
    a circuit element coupled between the collector and an output of the circuit, wherein the circuit element is selected to provide isolation of the load from the collector at a second harmonic of the second frequency,
    wherein the first matching network is tuned to reduce intermodulation distortion by cancellation of intermodulation products resulting from even-order nonlinearity with intermodulation products resulting from odd-order nonlinearity.

14. The circuit of claim 13 wherein the circuit element is configured to provide an approximate short circuit to AC ground or an approximate series open at the second harmonic of the second frequency.

15. A method for reducing intermodulation distortion from an active circuit that operates on an input signal including a desired signal centered at a first frequency and undesired signals centered at a second frequency, the method comprising:
    determining a load impedance of the active circuit;
    determine a source impedance of the active circuit;
    modeling the active circuit with a nonlinear model having an input and an output, wherein the input of the model couples to the source impedance and the output of the active circuit couples to the load impedance;
    defining a first matching network, wherein the first matching network is coupled between either the model input and the source impedance or the model output and the load impedance;
    computing intermodulation distortion resulting from the active circuit for one or more impedance values of the first matching network, wherein the impedance values are computed at either a sub-harmonic frequency or a second harmonic of the second frequency; and
    selecting an impedance value for the first matching network that reduces the intermodulation distortion.

16. The method of claim 15 further comprising:
    shorting the output impedance of the active circuit at the second harmonic of the second frequency.

17. The method of claim 15 wherein the first matching network is coupled between the model output and the load impedance.

18. The method of claim 15 wherein the first matching network is coupled between the model input and the source impedance.

19. The method of claim 18 further comprising:
    determining an input matching network impedance ($Z_{imn}$) based on the source impedance and the selected impedance value of the first matching network; and
    maintaining approximately similar values for $Z_{imn}$ in a range of frequencies centered about the first frequency.

20. The method of claim 15 wherein the first matching network is coupled between the model input and the source impedance, the method further comprising:
    defining a second matching network coupled between the model output and the load impedance;

computing intermodulation distortion resulting from the active circuit for one or more impedance values of the second matching network, wherein the impedance values are computed at either a sub-harmonic frequency or a second harmonic of the second frequency; and selecting impedance values for the first and second matching networks that reduce the intermodulation distortion.

21. The method of claim 20 further comprising:

determining an input matching network impedance ($Z_{imn}$) based on the source impedance and the selected impedance value of the first matching network;

determining an output matching network impedance ($Z_{omn}$) based on the load impedance and the selected impedance value of the second matching network; and selecting values for $Z_{imn}$ and $Z_{omn}$ in a range of difference and upper frequencies and second frequencies that minimize intermodulation distortion, wherein the range of difference frequencies is defined by the range of frequency separations of undesired signals, and wherein the range of upper frequencies is defined by the range of second harmonics of the second frequencies of the undesired signals.

22. The method of claim 15 further comprising:

shorting the source impedance at the second harmonic of the second frequency.

23. The method of claim 15 wherein the first matching network is tuned to reduce intermodulation distortion by cancellation of intermodulation products resulting from even-order nonlinearity with intermodulation products resulting from odd-order nonlinearity.

24. The method of claim 15 wherein the first matching network realizes a first complex value at the sub-harmonic frequency and an imaginary value for the input impedance at the second harmonic of the second frequency that reduce intermodulation distortion.

* * * * *